United States Patent
Schmidt et al.

(10) Patent No.: US 6,181,227 B1
(45) Date of Patent: Jan. 30, 2001

(54) MAGNET COIL WITH PARALLEL CONDUCTOR PATHS

(75) Inventors: Hartmut Schmidt, Karlsruhe; Michael Westphal, Offenbach, both of (DE)

(73) Assignee: Brucker Analytik GmbH, Rheinstetten (DE)

( * ) Notice: Under 35 U.S.C. 154(b), the term of this patent shall be extended for 0 days.

(21) Appl. No.: 09/492,121

(22) Filed: Jan. 27, 2000

(30) Foreign Application Priority Data

Feb. 2, 1999 (DE) ................................................ 199 04 101

(51) Int. Cl.[7] ................................ H01F 5/00; G01V 3/00
(52) U.S. Cl. .............................................. 335/299; 324/318
(58) Field of Search .......................... 335/299; 336/200, 336/232; 324/318, 319, 320

(56) References Cited

U.S. PATENT DOCUMENTS

| | | | |
|---|---|---|---|
| 5,311,135 | * 5/1994 | Vavrek et al. ........................ | 324/318 |
| 5,323,135 | 6/1994 | Schmidt et al. . | |
| 5,343,148 | 8/1994 | Westphal et al. . | |
| 5,563,567 | 10/1996 | Westphal . | |
| 5,666,054 | 9/1997 | Westphal . | |
| 5,959,454 | 9/1999 | Westphal et al. . | |
| 5,998,998 | 12/1999 | Westphal . | |

* cited by examiner

Primary Examiner—Ray Barrera
(74) Attorney, Agent, or Firm—Paul Vincent

(57) ABSTRACT

The windings of an NMR magnet coil are formed of at least two adjacent non-crossing conductor paths which are electrically insulated from one another. Each conductor path of a partial coil can be transformed geometrically into one respective conductor path in each partial coil through the symmetrical operations. The various conductor paths in each partial coil are coded in such a manner that the conductor paths adjacent to one another in a winding and attributed with identical successive cardinal numbers as code numbers in their geometric order. The conductor paths in the various partial coils which can be transformed into one another through symmetrical operations have the same code numbers. Each conductor path in a partial coil is electrically connected in series with one conductor path each in at least one other partial coil. These series connections of conductor paths are electrically connected to one another in parallel. The sum of the code numbers of the conductor paths connected in series in the various partial coils is identical in each case with all series connections of conductor paths which are connected in parallel. In this manner it is possible, with an extremely small number of crossings, to avoid the problem of strong current redistributions by eddy currents in the generation of magnetic fields which are rapidly variable with time.

18 Claims, 5 Drawing Sheets

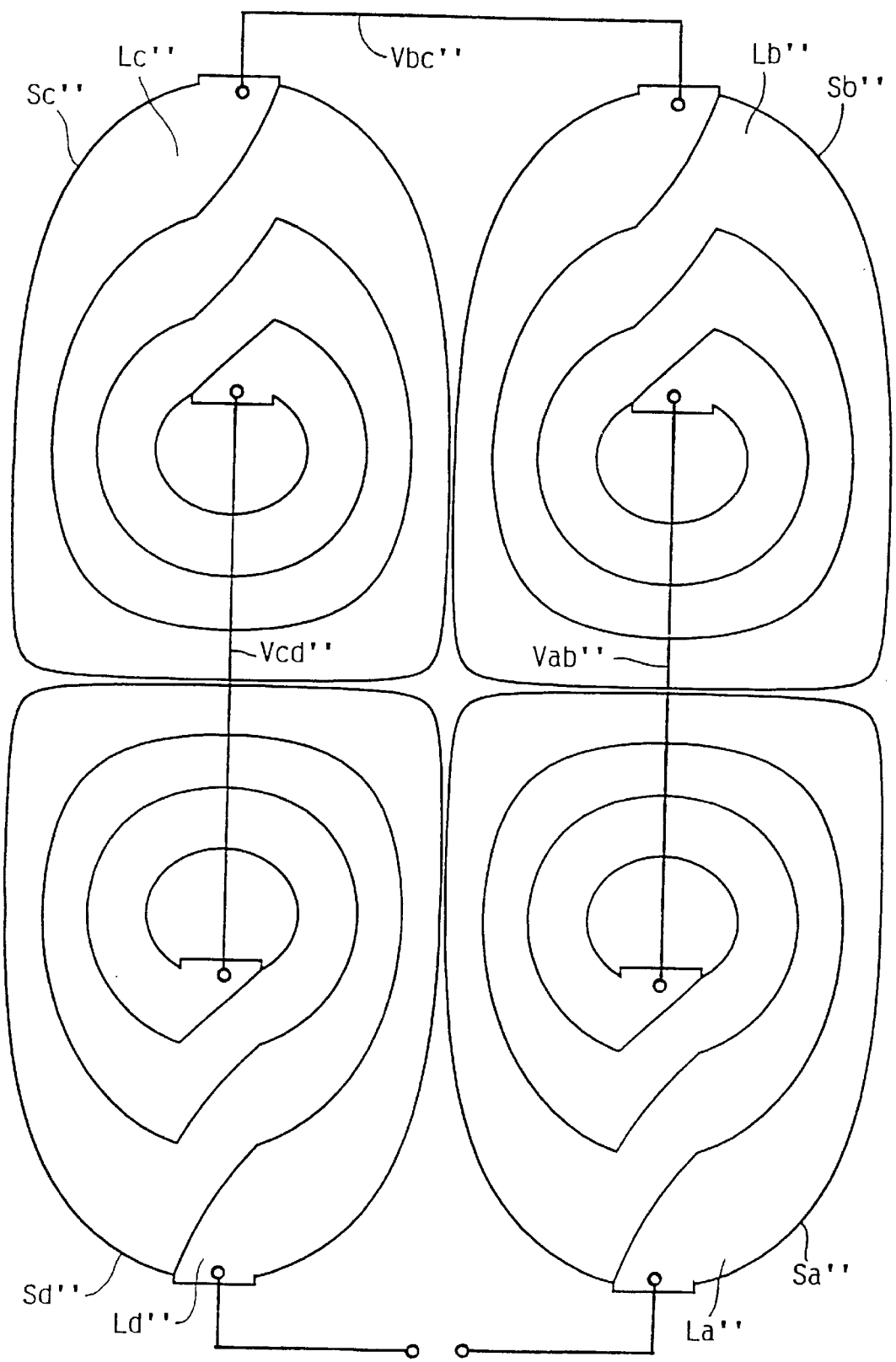
PRIOR ART  Fig. 5

MAGNET COIL WITH PARALLEL CONDUCTOR PATHS

This application claims Paris convention priority of German patent application 199 04 101.6 filed Feb. 2, 1999, the complete disclosure of which is hereby incorporated by reference.

BACKGROUND OF THE INVENTION

The invention relates to a magnet coil for generating temporally rapidly varying magnetic fields, preferably in a nuclear magnetic resonance (=NMR) apparatus, which is divided into an even number of partial coils which are symmetrical with respect to one another, wherein each partial coil can be reproduced geometrically through one or two symmetrical operations, namely turning about an axis by 180° and/or through reflection on a plane, on any other partial coil, and wherein each partial coil consists of several windings of a metallic material which are arranged on the surface of a geometric body.

Magnet coils of this type are known e.g. from U.S. Pat. Nos. 5,323,135 or 5,343,148.

An essential part of NMR systems which are generally used for tomography, partly also for spectroscopy, is a system of normally three gradient coils consisting of several partial coils which are supplied with currents of different strengths independently of one another. The purpose of these gradient coils is to superimpose spatially constant magnetic field gradients with adjustable strength to the uniform magnetic field BOz of the main field magnet of the NMR apparatus, the field being directed in the direction of a z-axis, where the direction of one of the gradients (dBz/dz) is usually parallel to the direction of the uniform main field BOz (z-gradient=axial gradient) and where the directions of the two other gradients (dBz/dx, dBz/dy) are orthogonal to each other and to the direction of the axial gradient consists, transverse to the direction of the main field (x- and y-gradients=transverse gradients). The spatial range, in which the magnetic field of these gradient coils is approximately linear, can be utilized for NMR methods with spatial resolution (imaging, space selective spectroscopy) if this range is not further limited by inhomogeneities of the main field.

The gradient coils may be embodied e.g. as x-, y- and z-coils on cylinder surfaces for conventional tomography magnets or as gradient coils for gradient accelerated NMR spectroscopy. In addition thereto, there are also known flat gradient plates for pole shoe magnets in NMR tomography. With respect to the geometric design of gradient coils, U.S. Pat. Nos. 5,666,054 and 5,563,567 are incorporated herein by reference, in which the spatial design of gradient coils is described in detail.

A particularly advantageous gradient coil system in which on the one hand, under presettable boundary conditions, the inductance L and additionally also technically relevant parameters of the magnetic coil arrangement, like e.g. the current density distributions, shielding effect etc. can be optimized independently of one another, is described in the initially cited U.S. Pat. No. 5,323,135.

A feature common to all the magnet coils mentioned herein consists in that they are formed of an even number of at least two partial coils which are arranged symmetrical with respect to one another in order to generate the normally desired spatially symmetric profile of the magnetic field. These partial coils can be transformed to one another basically by two symmetrical operations, namely the reflection by one plane or by turning about an axis by 180°. The transverse gradient coils known e.g. from U.S. Pat. No. 5,323,135 consist of four partial coils of this type arranged on the surface of a circular cylinder; the transverse gradient coils known from U.S. Pat. No. 5,343,148 consist of two partial coils arranged on the surface of a circular cylinder. Axial gradient coils and coils for generating a homogeneous magnetic field in general consist of two partial coils arranged on the surface of a circular cylinder. The transverse gradient coils known from U.S. Pat. 5,959,454 consist of two coplanar partial coils.

The performance of nuclear magnetic resonance tomographs can, in general, be improved if the magnetic fields generated by the gradient coils are particularly strong. This is achieved, in addition to optimizing the geometric arrangement of the conductor paths of the gradient coils extending in windings, by operation at high electric currents. In order to keep the heat usually generated by Ohmic losses, as small as possible, the conductor paths in the gradient coils have a large cross-section and extend laterally to their direction on a surface such that the electric current density that causes the heating up remains as small as possible. A disadvantage of such a gradient coil arrangement is however that on rapid switching of gradients with such (streamline) gradient coils current distributions due to eddy currents occur in the broad conductor paths, disturbing the magnetic field of the gradient coil in the useful volume of the NMR-apparatus. Furthermore, the mentioned eddy currents may lead to an increased heating up of the gradient coil system as compared to operation with direct current and identical generated field strength, and thus to limitation of the performance data.

U.S. Pat. No. 5,998,998 describes a solution of this problem. U.S. Pat. No. 5,998,998 provides, instead of one broad conductor path, at least two conductor paths which are electrically connected in parallel and cross each other n times per winding, wherein n is an integral with n<8, preferably n=1 or n=2 and where in the conductor paths extend essentially in a geometrically parallel manner between the crossings.

The division into parallel conductor paths with otherwise identical conditions has the effect that the number of conductor paths on the same surface is multiplied, at least doubled. Thus, the width of the individual conductor paths can be halved or even further reduced. This drastically reduces the possibility of generating eddy currents in the conductor paths, without changing the entire inductance L of the gradient coil.

The geometric interconnection between the individual, essentially in parallel extending, conductor paths by means of the current crossings guarantees that after switching there will be hardly any current redistributions in the conductor paths connected electrically in parallel due to different electric resistances or inductances.

However, magnet coils according to U.S. Pat. No. 5,998,998 have the disadvantage that the number of crossings equals at least half the number of windings in all partial coils and that the realization of the numerous crossings is relatively demanding such that the production of such coils is expensive.

SUMMARY OF THE INVENTION

For this reason, it is the object of the present invention to modify magnet coils for generating magnetic fields which are rapidly variable with time with means as simple as possible in such a manner that they neither show the problem of large current redistributions by eddy currents nor the disadvantage of needing a large number of crossings of conductive paths which are demanding to realize.

According to the present invention, this object is achieved completely in that the windings consist of at least two conductor paths, being electrically insulated from each other and arranged beside each other on the surface of the geometric body and do not cross each other, wherein each conductor path of a partial coil can be geometrically transformed to a corresponding conductor path of any other partial coil by means of the above-mentioned symmetrical operations, wherein the various conductor paths in each partial coil are coded in a way that the conductor paths adjacent in a winding, are attributed with subsequent cardinal numbers as code numbers corresponding to their geometric order within this winding and that the conductor paths in the various partial coils which can be transformed into each other by the said symmetrical operations are attributed with the same code numbers, wherein each conductor path in a partial coil is electrically connected in series with, in each case, one conductor path in at least one other partial coil, and the series connections of conductor paths generated in this manner are electrically connected in parallel, and wherein in this circuit the sum of the code numbers of the conductor paths connected in series is identical in all series connections of the conductor paths which are connected in parallel to each other.

In this manner it is possible to achieve a parallel connection of conductor paths, similar to U.S. Pat. No. 5,998,998, which are always supplied by essentially identical currents. While the conductor paths in each individual partial coil are connected in parallel in U.S. Pat. No. 5,998,998, the series connections of conductor paths of various partial coils are connected in parallel in the inventive magnet coil. While according to U.S. 5,998,998, the example of a transverse gradient coil according to U.S. Pat. No. 5,323,135 having four partial coils with 10 windings each, one would have to produce a total of 4×5=20 crossings in the case of two parallel conductor paths, the magnet coil according to the present invention provides only crossings in the electric connections between the partial coils, i.e. a maximum of 3 crossings. Realization without any crossings at all is also possible.

The invention is based on the findings, that on the one hand, as pointed out already in U.S. Pat. No. 5,998,998, conductor paths connected in parallel are always supplied by the same currents, also during switching operations, exactly when they have the same electric resistance and the same inductance, and, on the other hand, that theoretically it is exactly possible to get exactly identical resistances and inductances in all series connections of conductor paths from different partial coils due to the symmetry of the partial coils with respect to one another in a manner as described in the main claim.

A further advantage of the inventive magnet coil as compared with respect to the "twisted coil" resides in that the inventive magnet coil can be designed more flat in a radial direction since no "line twist" but merely a "current twist" has to be realized. Thus, the inventive magnet coil designed as gradient coil may be made compact in the radial direction which entails an improvement of the gradient quality and stronger gradient fields. The radial compaction reduces the distance of the conductor paths from the cooling system such that the thermal resistances are reduced and an improved cooling and thus a higher maximum thermal load limit of the coil system is achieved.

The present invention can be transferred also to coil systems which are not exactly symmetrical, as long as the inductances and Ohmic resistances of the conductor paths in the paralleled branches of the coil system are approximately identical.

One embodiment of the invention is particularly preferred, in which portions of the conductor paths are formed in a streamline manner between the crossings. Streamline-shaped magnet coils of this type have particularly large conducting cross-sections and thus particularly small Ohmic losses.

In an alternative embodiment of the inventive magnet coil, the conductor paths consist of wires. The production of a magnet coil of this type is particularly simple and cheap.

In simple embodiments of the inventive magnet coil, the geometric body on which the windings of the partial coils are disposed, is cylindrical.

As an alternative, the inventive magnet coil may be made in such a manner that the geometric body bearing the windings of the partial coil, is limited by planes.

The embodiment of the inventive magnet coil as gradient coil is particularly preferred since the above-described advantages of the invention, in particular the minimization of eddy currents in particular with frequent switching of the currents, as it is typical with gradient coils, is particularly emphasized.

One embodiment of the invention is also particularly preferred in which the magnet coil is attributed with a shielding coil which shields the magnetic field generated by the magnet coil from conductive structures of the NMR apparatus. The shielding can minimize the generation of eddy currents in the metallic structures of the NMR apparatus such that the distortions of the magnetic field gradient generated by the magnet coil are further reduced in the measuring volume.

In a particularly advantageous further development of this embodiment, the shielding coil is also designed according to the features described in the main claim. The resulting distribution of the single original conductor path into several parallel conductor paths through which theoretically always the same current flows, enables an improved adaptation of the actual real current density to the current density in the shielding coil which is theoretically required for achieving an optimum shielding effect.

Further advantages of the invention are given by the description and the drawings. The features mentioned above and below may be utilized according to the invention individually or in any arbitrary combination. The embodiments shown and described are not to be understood as a complete list but rather have exemplary character for describing the invention.

The invention is shown in the drawing and is explained in more detail by means of embodiments. In the drawing:

BRIEF DESCRIPTION OF THE DRAWING

FIG. 5 shows the unrolled pattern of four partial coils according to prior art according to U.S. Pat. No. 5,323,135.

DETAILED DESCRIPTION OF THE PREFERRED EMBODIMENTS

Figure 4:
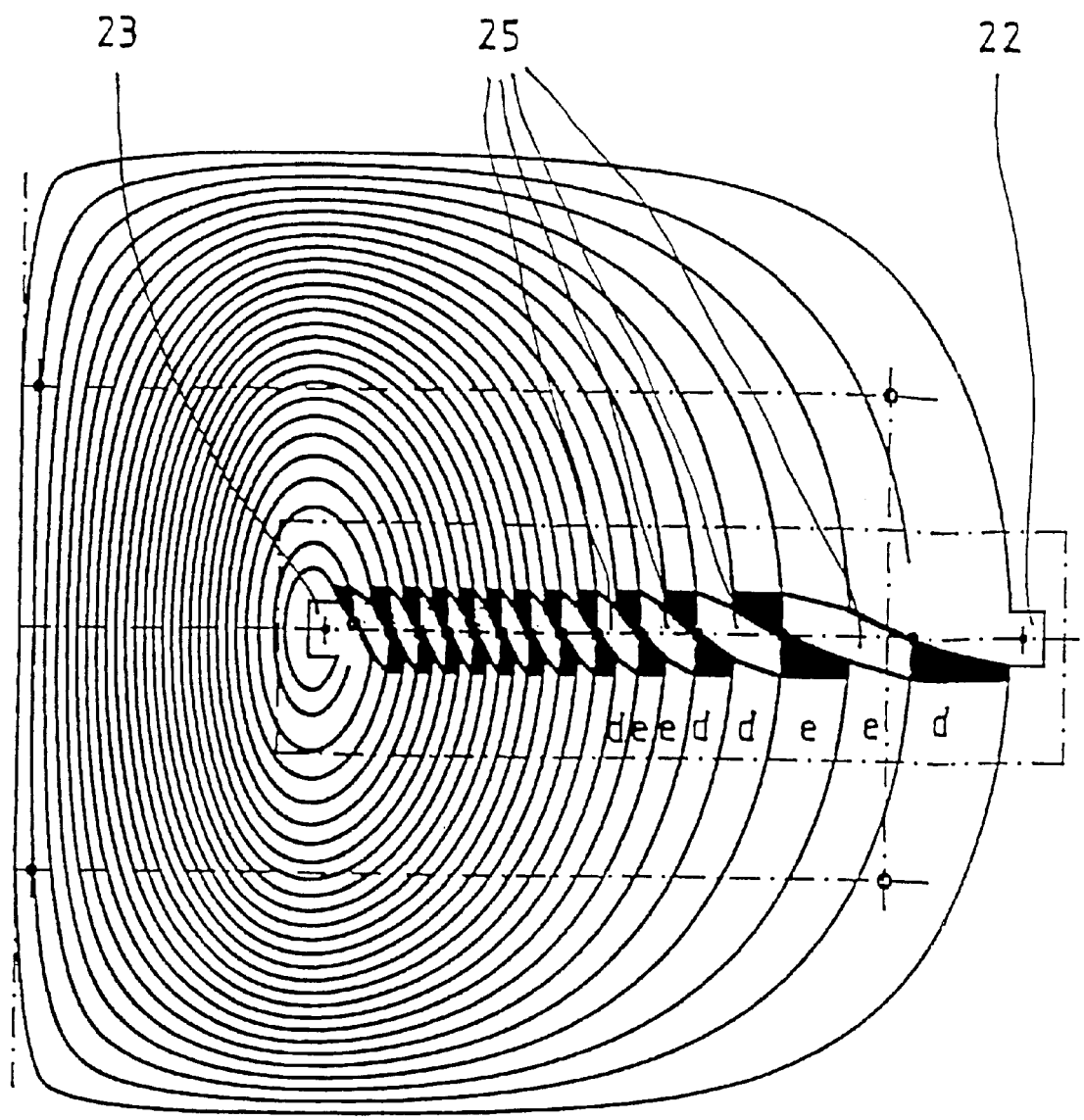
FIG. 4 shows the unrolled pattern of a partial coil according to prior art according to U.S. Pat. No. 5,998,998.

The unrolled pattern of a partial coil of a known transverse gradient coil according to U.S. Pat. No. 5,998,998 with reduced eddy current disturbances, shown in FIG. 4, comprises numerous crossings 25 of the conductor paths d, e within the partial coil and is thus, on the one hand, relatively demanding to produce, and on the other hand comprises particularly thick radial dimensions at the crossing points. The known coil is "streamline"-shaped and comprises two conductor paths d and e which extend essentially in parallel and are supplied with current in parallel via a current input member 22. Having passed the quadrant of the coil the parallel currents leave via a common connection piece 23. The conductor paths cross each other at the crossing points 25 in each case after passage through one complete winding (i.e. 360°). The embodiment shown provides a total of twelve crossing points 25.

FIG. 5 shows a unrolled pattern of a transverse gradient coil consisting of four partial coils Sa", Sb", Sc" and Sd" according to prior art, known e.g. from U.S. Pat. No. 5,323,135. The four partial coils Sa", Sb", Sc", Sd" each comprise a broad conductor path La", Lb", Lc" and Ld" and are electrically connected in series with the connecting conductors Vab", Vbc", Vcd", schematically shown therein.

Figure 1:
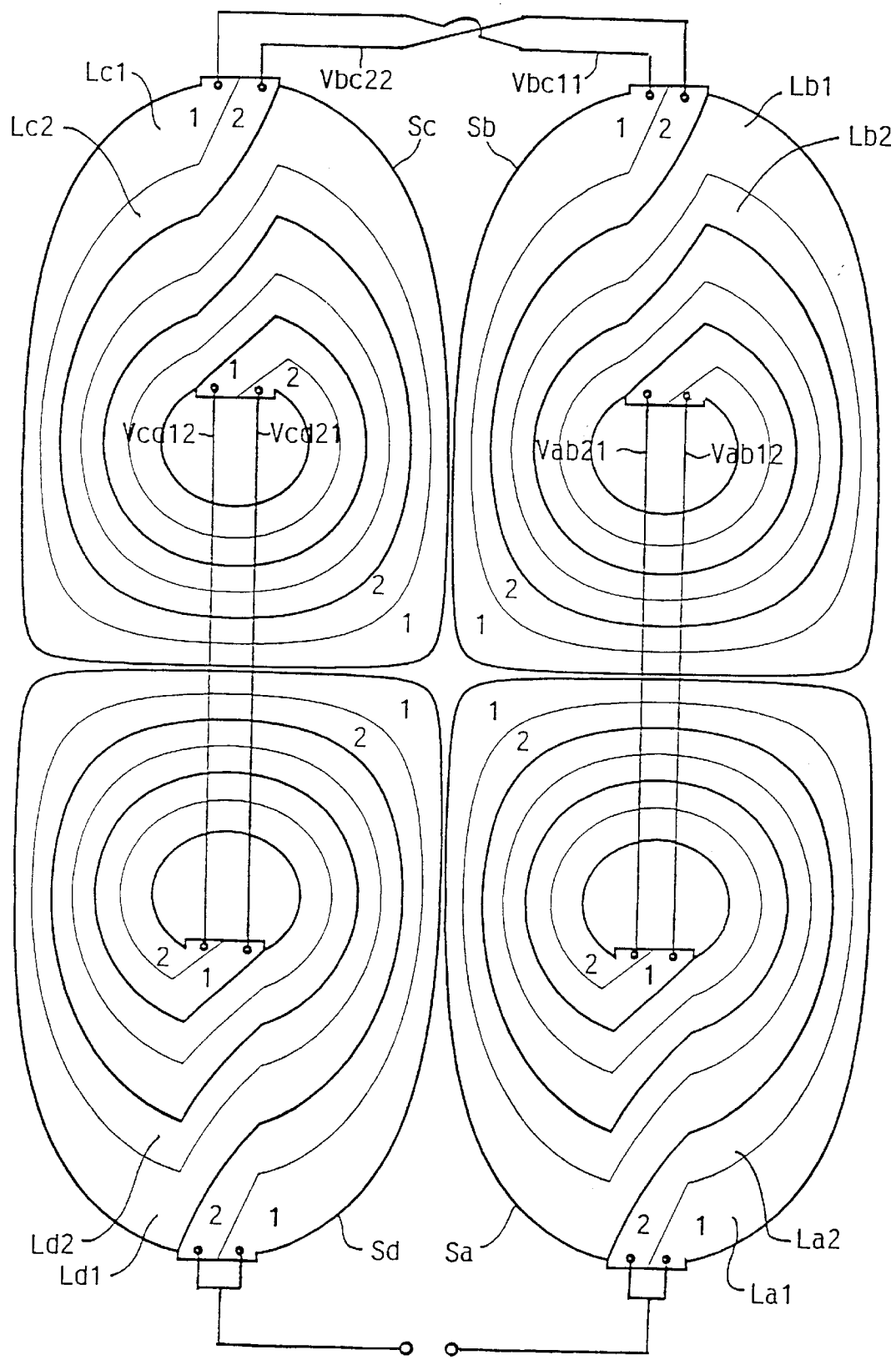
FIG. 1 shows the unrolled pattern of a magnet coil consisting of four partial coils modified according to the invention, wherein the windings are divided into two parallel conductor paths.

FIG. 1 shows the unrolled pattern of a transverse gradient coil modified according to the invention wherein, as compared with the known coil shown in FIG. 5, the original conductor path of each of the four partial coils Sa, Sb, Sc, Sd is divided into two conductor paths each, La1, La2; Lb1, Lb2; Lc1, Lc2 and Ld1, Ld2 with the code numbers 1 and 2. The four partial coils Sa, Sb, Sc, Sd are electrically connected with the connecting conductors Vab12, Vab21; Vbc11, Vbc22; Vcd12, Vcd21 according to the features of the main claim. In this case, the conductor paths of all four partial coils are electrically connected in series. The sum of the code numbers of the serially connected conductor paths is 1+2+2+1=2+1+1+2=6. Herein, the electric connection is selected within the scope of the features of the main claim such that there is exactly one crossing of the connecting conductors, namely the crossing of the connecting conductors Vbc11 and Vbc22. The conductor paths are connected in parallel at the input terminals of the partial coils Sa and Sd.

Figure 2:
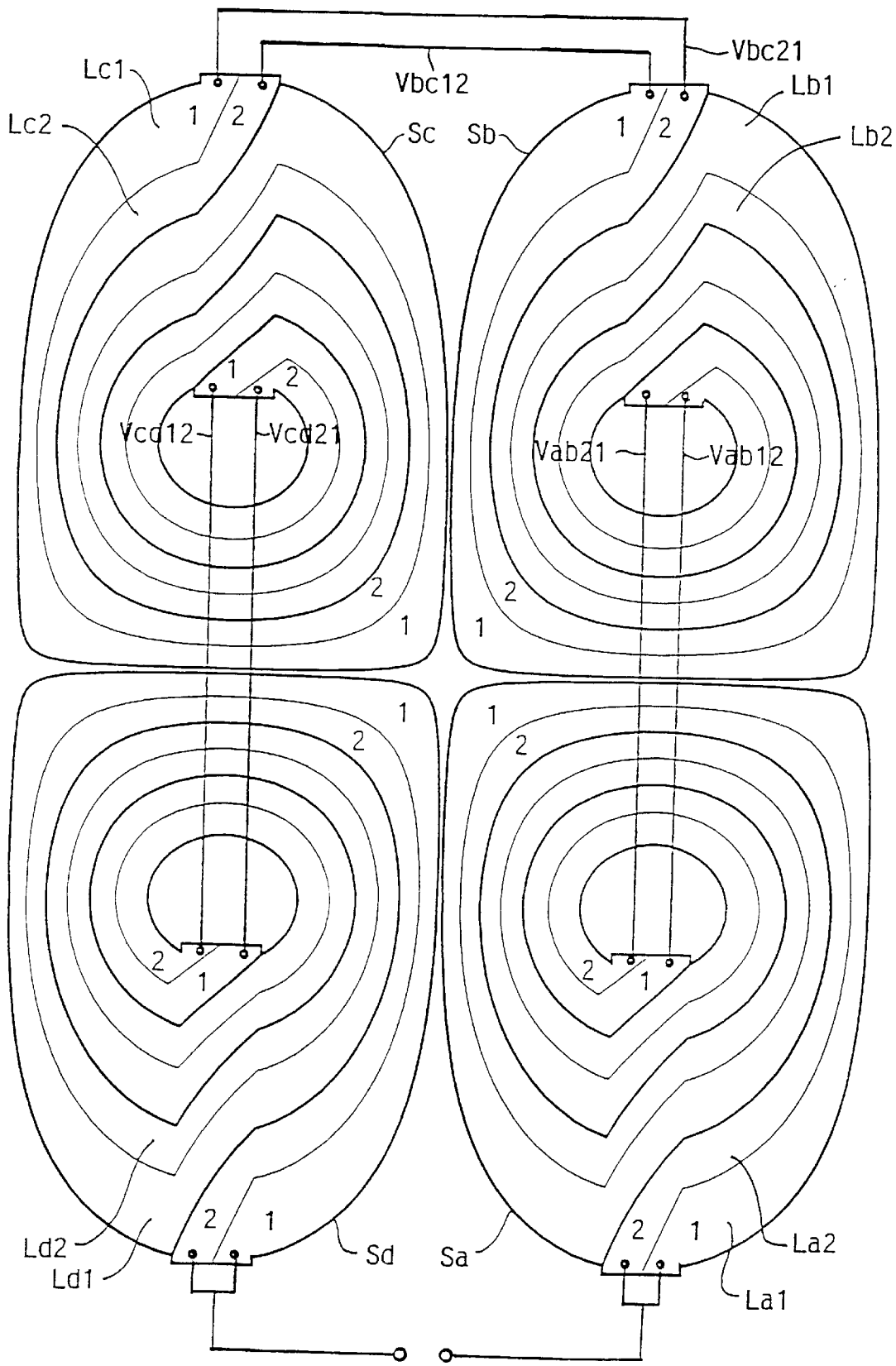
FIG. 2 shows the unrolled pattern of a magnet coil according to the invention as in FIG. 1, without any crossings between connecting conductors between the individual partial coils.

FIG. 2 shows the unrolled pattern of a further transverse gradient coil modified according to the invention, wherein in contrast to FIG. 1, there is no crossing of connecting conductors Vab12, Vab21; Vbc12, Vbc21; Vcd12, Vcd21 at all.

In many cases, however, an electric connection according to FIG. 1 is preferred for the following reason: In practice, one cannot rule out completely a slight irregular distribution of the electric current to the two paralleled branches, since e.g. the electric resistances of the two branches do not have to be exactly identical due to irregular heating up. Then, the connection according to FIG. 2 causes a weak field of interference with the geometry of an axial gradient field, whereas with the connection according to FIG. 1 only a still weaker field of interference of higher order would be produced.

Figure 3:
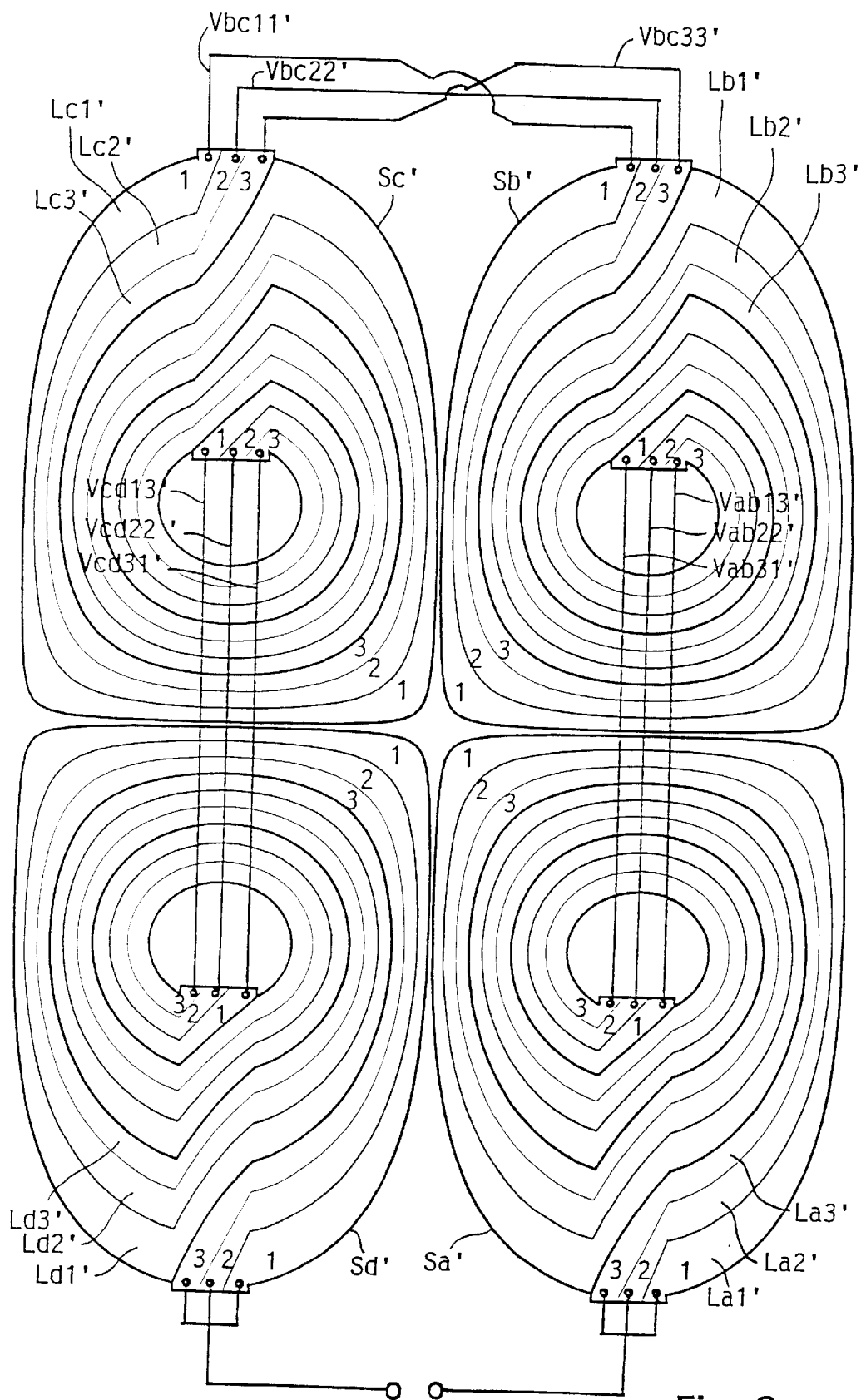
FIG. 3 shows the unrolled pattern as in FIG. 1 comprising, however, three instead of two parallel conductor paths.

FIG. 3 finally shows the unrolled pattern of a transverse gradient coil modified according to the invention in which in contrast to FIG. 1 and FIG. 2, the conductor path of FIG. 5 is divided for each partial coil Sa', Sb', Sc', Sd' not into two but into three parallel conductor paths La1', La2', La3'; Lb1', Lb2', Lb3'; Lc1', Lc2', Lc3', and Ld1', Ld2', Ld3' with the code numbers 1, 2, and 3. The sum of the code numbers of the conductor paths connected in series is 1+3+3+1=3+1+1+3=2+2+2+2=8. Here, a connection with a crossing of the connecting conductors Vbc11', Vbc22' and Vbc33' is selected, whereas the connecting conductors Vab13', Vab22', Vab31' and Vcd13', Vcd22', Vcd31' extend without any crossings in each case.

We claim:

1. Magnet coil for generating magnetic fields which are rapidly variable with time in a nuclear magnetic resonance (NMR) apparatus, which is divided into a number of partial coils (Sa,Sb,Sc,Sd;Sa',Sb',Sc',Sd') which are symmetrical to one another, wherein each partial coil can be geometrically transformed into any other partial coil by one or two symmetrical operations, namely turning about an axis by 180° and/or by reflection by a plane, and wherein each partial coil consists of several windings of a metallic material which are arranged on the surface of a geometric body, characterized in that the windings are formed of at least two conductor paths (La1, La2, Lb1, Lb2, Lc1, Lc2, Ld1, Ld2; La1', La2', La3', Lb1', Lb2', Lb3', Lc1', Lc2', Lc3', Ld1', Ld2', Ld3'), which are electrically insulated from each other and adjacent to each other on the surface of the geometric body and do not cross each other, wherein each conductor path of a partial coil can be geometrically transformed into one respective conductor path in any other partial coil by means of the said symmetrical operations, wherein the various conductor paths in each partial coil are coded in such a manner that the conductor paths (La1, La2 . . . ) adjacent in a winding are attributed with subsequent cardinal numbers as code numbers (1,2,3 . . . ) corresponding to their geometric order within this winding and that the conductor paths (La1, La2; Lb1, Lb2, . . . ) in the various partial coils (Sa, Sb, . . . ) which can be transformed into each other through the symmetrical operations, have the same code numbers (1,2, . . . ), wherein each conductor path in a partial coil is electrically connected in series with one respective conductor path in at least one other partial coil, and the series connections of conductor paths generated in this manner are electrically connected in parallel with each other, and wherein in said connection, the sum of the code numbers (1,2, . . . ) of the conductor paths connected in series in the various partial coils is the same in all series connections of conductor paths which are connected in parallel to each other.

2. Magnet coil according to claim 1, characterized in that the conductor paths consist of wires.

3. Magnet coil according to claim 1, characterized in that the conductor paths (La1, La2, Lb1, Lb2, . . . ) are formed in a streamline manner.

4. Magnet coil according to claim 3, characterized in that the windings of the partial coils (Sa, Sb, Sc, . . . ) are cylindrical.

5. Magnet coil according to claim 3, characterized in that the windings of the partial coils are limited by planes.

6. Magnet coil according to claim 1, characterized in that the windings of the partial coils (Sa, Sb, Sc, . . . ) are cylindrical.

7. Magnet coil according to claim 1, characterized in that the windings of the partial coils are limited by planes.

8. Magnet coil according to claim 1, characterized in that the magnet coil is a gradient coil.

9. Magnet coil according to claim 8, characterized in that the windings of the partial coils (Sa, Sb, Sc . . . ) are cylindrical.

10. Magnet coil according to claim 8, characterized in that the windings of the partial coil are limited by planes.

11. Magnet coil according to claim 1, characterized in that the magnet coil is a shielding coil which shields a magnetic field with respect to conductive structures of the nuclear magnet resonance apparatus.

12. Magnet coil according to claim 11, characterized in that the windings of the partial coils (Sa, Sb, Sc, . . . ) are cylindrical.

13. Magnet coil according to claim 11, characterized in that the windings of the partial coils are limited by planes.

14. Magnet coil according to claim 11, characterized in that the magnet coil shields a gradient coil.

15. Magnet coil according to claim 11, characterized in that the conductor paths (La1, La2, Lb1, Lb2, . . . ) are formed in a streamline manner.

16. Magnet coil according to claim 15, characterized in that the magnet coil shields a gradient coil.

17. Magnet coil according to claim 16, characterized in that the windings of the partial coils are cylindrical.

18. Magnet coil according to claim 16, characterized in that the windings of the partial coils are limited by planes.

* * * * *